United States Patent
Duncan et al.

(10) Patent No.: US 10,820,451 B2
(45) Date of Patent: Oct. 27, 2020

(54) MULTIMODE COOLING CONTROL OF AIR HANDLING UNITS TO PREVENT CONDENSATION

(71) Applicant: DELL PRODUCTS, L.P., Round Rock, TX (US)

(72) Inventors: Tyler B. Duncan, Austin, TX (US); Trey S. Wiederhold, Cedar Park, TX (US); Michael M. Toulouse, San Jose, CA (US); Ty R. Schmitt, Round Rock, TX (US)

(73) Assignee: Dell Products, L.P., Round Rock, TX (US)

( * ) Notice: Subject to any disclaimer, the term of this patent is extended or adjusted under 35 U.S.C. 154(b) by 219 days.

(21) Appl. No.: 15/960,361

(22) Filed: Apr. 23, 2018

(65) Prior Publication Data

US 2019/0327861 A1 Oct. 24, 2019

(51) Int. Cl.
*H05K 7/20* (2006.01)

(52) U.S. Cl.
CPC ..... *H05K 7/20836* (2013.01); *H05K 7/20745* (2013.01); *H05K 7/20827* (2013.01); *H05K 7/20145* (2013.01)

(58) Field of Classification Search
CPC ........... H05K 7/20827; H05K 7/20745; H05K 7/20836; H05K 5/0213
See application file for complete search history.

(56) References Cited

U.S. PATENT DOCUMENTS

| | | | |
|---|---|---|---|
| 7,762,718 B2 | 7/2010 | Kearney et al. | |
| 7,852,627 B2 | 12/2010 | Schmitt et al. | |
| 8,266,921 B2 | 9/2012 | Tashiro | |
| 9,167,721 B2 | 10/2015 | Campbell et al. | |
| 9,237,681 B2 | 1/2016 | Slessman et al. | |
| 9,510,485 B2 | 11/2016 | Schmitt et al. | |
| 10,180,261 B1 * | 1/2019 | Ross | F24F 11/30 |
| 2012/0144851 A1 * | 6/2012 | Hay | H05K 7/20745 62/91 |
| 2012/0212901 A1 * | 8/2012 | Schmitt | G06F 1/20 361/679.47 |
| 2014/0016256 A1 | 1/2014 | Lin | |
| 2014/0355203 A1 | 12/2014 | Kondo | |
| 2014/0371920 A1 * | 12/2014 | Varadi | G05B 13/048 700/276 |
| 2015/0342096 A1 * | 11/2015 | Czamara | H05K 7/1497 361/679.49 |
| 2016/0195293 A1 | 7/2016 | Schmitt et al. | |

(Continued)

*Primary Examiner* — Vincent H Tran
(74) *Attorney, Agent, or Firm* — Isidore PLLC

(57) ABSTRACT

A cooling system, large-scale information handling system (LIHS), and method avoid vapor condensation in information technology (IT) modules by operating all air handling units (AHU) in the same mode of operation. An AHU supervisory controller of the cooling system determines whether a trigger condition exists that indicates a risk of vapor condensation in the at least one IT module within LIHS that is cooled by more than one AHU. Each AHU directs the intake of cooling air in a selected mode of operation from among: (i) an outside air mode; and (ii) a mechanically cooled air mode. In response to determining that the trigger condition exists, the AHU supervisory controller triggers all AHUs to operate in a mode of operation selected to avoid condensation.

18 Claims, 10 Drawing Sheets

(56) References Cited

U.S. PATENT DOCUMENTS

2016/0198593 A1\* 7/2016 Schmitt .............. H05K 7/20745
　　　　　　　　　　　　　　　　　361/679.49
2017/0159951 A1　 6/2017 Slessman et al.
2017/0295677 A1　10/2017 Shelnutt et al.
2018/0039307 A1\* 2/2018 Hay ................... H05K 7/20745

\* cited by examiner

MULTIMODE COOLING CONTROL OF AIR HANDLING UNITS TO PREVENT CONDENSATION

BACKGROUND

1. Technical Field

The present disclosure relates in general to cooling systems in an information handling system (IHS), and more particularly to control of air handling units (AHUs) that provide cooling air to information technology (IT) modules of an IHS.

2. Description of the Related Art

As the value and use of information continue to increase, individuals and businesses seek additional ways to process and store information. One option available to users is information handling systems (IHSs). An IHS generally processes, compiles, stores, and/or communicates information or data for business, personal, or other purposes, thereby allowing users to take advantage of the value of the information. Because technology and information handling needs and requirements vary between different users or applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

Operation of information handling components and/or resources within IHSs may be adversely affected by the presence of heat. For example, heat may damage sensitive information handling resources and/or some information handling resources may not operate correctly outside of a particular range of temperatures. Thus, IHSs often include cooling systems configured to cool such information handling resources and/or maintain operational temperature within the required range.

BRIEF SUMMARY

In accordance with the teachings of the present disclosure, a cooling system includes more than one air handling unit (AHU). Each AHU provides cooling air to at least one information technology (IT) module within a large-scale information handling system (LIHS). Each AHU includes one or more actuators that directs the intake of cooling air in a selected mode of operation from among: (i) an outside air mode; and (ii) a mechanically cooled air mode. Each AHU includes an AHU controller that is in communication with the one or more actuators to control the one or more actuators to direct the intake of cooling air in the selected mode of operation. The cooling system includes an AHU supervisory controller that is in communication with the respective AHU controllers of the more than one AHU. The AHU supervisory controller executes a cooling mode utility that enables the cooling system to determine whether a trigger condition exists that indicates a risk of vapor condensation in IT modules of the LIHS. In response to determining that the trigger condition exists, the cooling mode utility enables the cooling system to trigger each AHU controller to all operate the one or more AHUs in a mode of operation selected to avoid condensation.

According to illustrative embodiments of the present disclosure, a LIHS includes at least one IT module and a cooling system. The cooling system includes more than one AHU that each provide cooling air to the at least one IT module, each AHU includes one or more actuators that directs the intake of cooling air in a selected mode of operation from among: (i) an outside air mode; and (ii) a mechanically cooled air mode. Each AHU includes an AHU controller in communication with the one or more actuators to control the one or more actuators to direct the intake of cooling air in the selected mode of operation. The cooling system includes an AHU supervisory controller in communication with the respective AHU controllers of the more than one AHU. The AHU supervisory controller executes a cooling mode utility that enables the cooling system to determine whether a trigger condition exists that indicates a risk of vapor condensation in IT modules of the LIHS. The cooling mode utility enables the cooling system to, in response to determining that the trigger condition exists, trigger each AHU controller to all operate the one or more AHUs in a mode of operation selected to avoid condensation.

According to illustrative embodiments of the present disclosure, a method includes determining, by an AHU supervisory controller, whether a trigger condition exists that indicates a risk of vapor condensation in at least one IT module within a LIHS. The LIHS is cooled by more than one AHU that direct the intake of cooling air in a selected mode of operation from among: (i) an outside air mode; and (ii) a mechanically cooled air mode. In response to determining that the trigger condition exists, the method includes triggering all AHUs to operate in a mode of operation selected to avoid condensation.

The above presents a general summary of several aspects of the disclosure in order to provide a basic understanding of at least some aspects of the disclosure. The above summary contains simplifications, generalizations and omissions of detail and is not intended as a comprehensive description of the claimed subject matter but, rather, is intended to provide a brief overview of some of the functionality associated therewith. The summary is not intended to delineate the scope of the claims, and the summary merely presents some concepts of the disclosure in a general form as a prelude to the more detailed description that follows. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which.

DETAILED DESCRIPTION

Figure 1A:
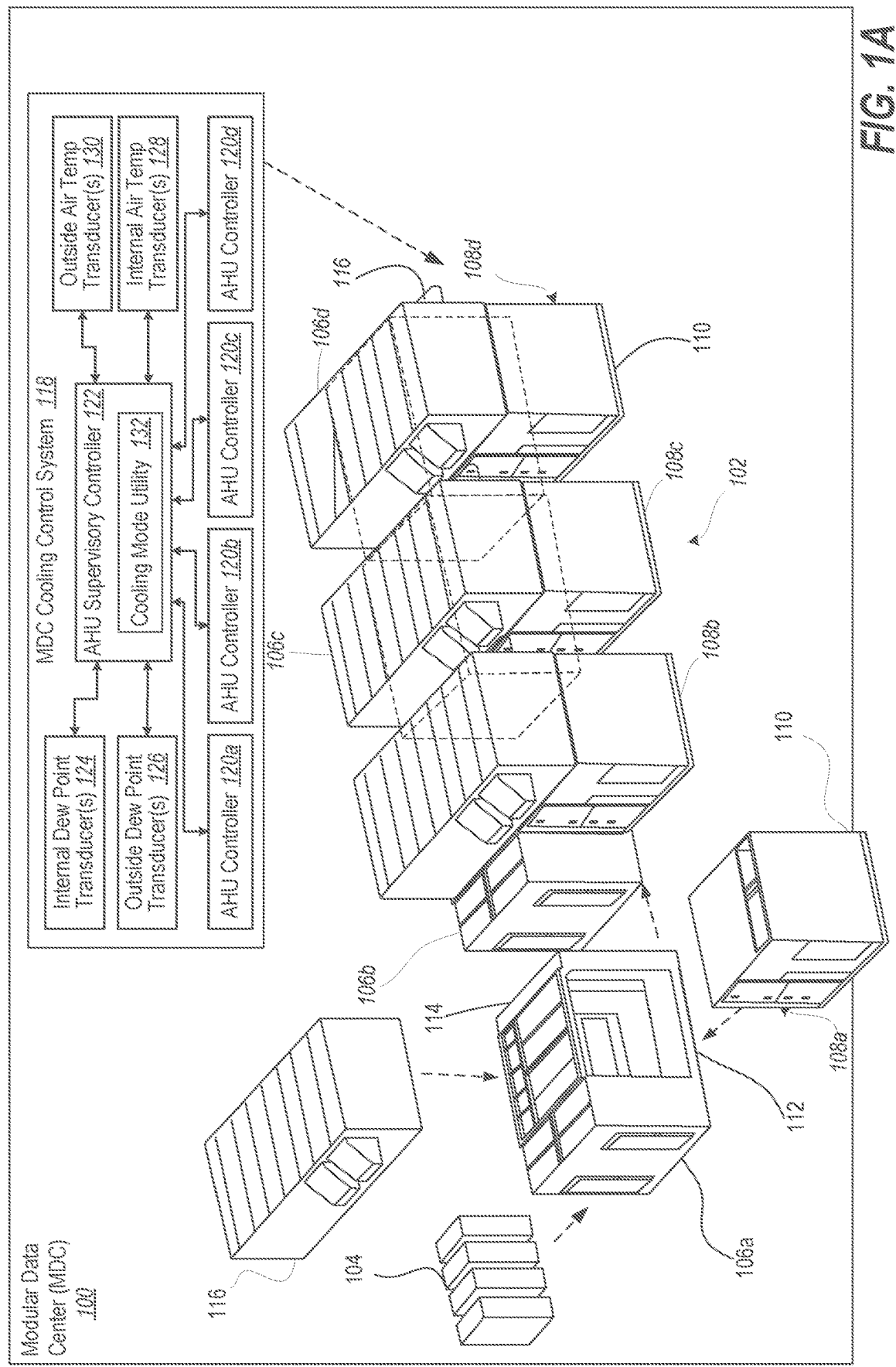
FIG. 1A is an isometric three dimensional (3D) depiction of an example large-scale information handling system (LIHS) configured as a modular data center (MDC) having multiple air handling units (AHUs) that provide mixed mode cooling with a block diagram of a cooling control system, according to one or more embodiments.

The present disclosure provides a cooling system, large-scale information handling system (LIHS), and method that avoid vapor condensation in information technology (IT) modules by operating all air handling units (AHU) in a selected mode of operation. An AHU supervisory controller of the cooling system determines whether a trigger condition exists that indicates a risk of vapor condensation in the at least one IT module within LIHS that is cooled by more than one AHU. Each AHU directs the intake of cooling air in a selected mode of operation from among: (i) an outside air mode; and (ii) a mechanically cooled air mode. In response to determining that the trigger condition exists, the AHU supervisory controller triggers all AHUs to operate in a mode of operation selected to avoid condensation.

According to aspects of the present innovation, a cooling system of an information handling system (IHS) has AHUs that each provide cooling air to at least one IT module. Air moving through the AHUs and IT modules is generally referred to as cooling air. Cooling air that is presented to the at least one IT module is referred to herein as IT supply air, such as via a cold aisle of each IT module. The cooling air that is warmed by the at least one IT module in passing from the cold aisle through rack-based IHSs is referred to herein as IT return air. IT return air is guided within at least one IT module and the AHUs. IT return air eventually is exhausted to the outside environment or recirculated in whole or in part within the AHUs. Each AHU is independently controlled by a respective AHU controller to optimize performance of the cooling system by controlling certain functions. In one or more embodiments, each AHU controller can select a mode of operation of the AHU as part of optimizing performance. Based on internal and outside temperature and relative humidity, the AHU controller selects one of: (i) an outside air mode; (ii) a mechanically-cooled air mode; and (iii) a mixed mode. The AHU controller can also recirculate a portion of the IT return air in order to warm the cooling air to be above a minimum temperature or to reduce relative humidity.

An AHU supervisory controller is in communication with respective AHU controllers of the AHUs and receives or detects current cooling mode settings from each of the AHU controllers. The AHU supervisory controller executes a cooling mode override (CMO) utility to determine whether at least one AHU is operating in an outside air mode, providing cooling air solely from the outside air source. In response to determining that at least one AHU is providing cooling air solely from the outside air source, the CMO utility causes the AHU supervisory controller to trigger any remaining AHU controllers operating in a different cooling mode to switch to the outside air mode and provide cooling air solely from the outside air source to prevent condensation in/around the IT module.

The present disclosure contemplates that the construction and configuration of cooling systems may be of particular difficulty in data centers. A data center will typically include multiple IHSs (e.g., servers), which may be arranged in racks. Modular data centers further arrange these racks in modular building blocks. Each IHS and its component information handling resources may generate heat, which can adversely affect the operation of the data center and/or the functional data processing components within the data center if the generated heat is not efficiently removed or reduced. Within conventional data centers, IHSs are often cooled via the impingement of air driven by one or more air movers. To effectively control the temperature of information handling resources, especially in installations in which a MDC is outdoor-exposed, the cooling systems employed with MDCs must provide support for extreme temperatures, weather, and airflow ranges. MDCs are thus often configured with cooling systems that are capable of utilizing outside air for economy, with mixed modes including recirculated or mechanically cooled air as required, to satisfy temperature limits and prevent condensation. Combining cooling air from multiple AHUs can cause situations leading to condensation within the MDC where a mode of operation of a particular AHU can affect an amount of moisture in combined cooling air flow or on surfaces that are conductively cooled by an adjacent AHU.

In one or more embodiments, independent control of the AHUs during normal operation can have a benefit of adjusting individually to slightly different circumstances at each AHU. One AHU can be exposed to a slightly different wind and sunlight pattern or have a different temperature of IT return air depending on assigned compute loads in each IT module. The corresponding AHU controller can independently select a mode of operation that is suitable for the particular AHU, benefitting the data center. The AHU supervisory controller can ignore AHUs operating in different modes of operation since each AHU is relied upon to maintain the resulting cooling air within an appropriate range of temperatures and relative humidity for combining to cool one or more IT modules. The AHU supervisory controller only overrides independent control of AHUs by switching all of AHUs to an outside air mode in response to an abnormal condition that requires a coordinated response across AHUs. For example, the scalability of an MDC can be rapidly deployed by leveraging independently controlled AHUs. Having a very simple AHU supervisory controller with a limited role of imposing an override can simplify integration and commissioning. AHU supervisory controller can require very few inputs and outputs. Conversely, certain configurations of MDCs can assign significant functionality on an AHU supervisory controller. Having access to all of the sensory and system cooling requirement information can allow an AHU supervisory controller to make more routine mode selections for all AHUs.

In one or more embodiments, switching all of AHUs to an outside air mode can be made automatically, without first performing a determination that the current configuration (of operating in different cooling modes) across the multiple AHUs will cause condensation. Instead, an AHU supervisory controller detects an operating condition that is indicative of causing condensation, or has at least some risk of causing condensation. The disclosure provides a conservative response whenever this operating condition is detected. For example, a failure condition of one AHU that prevents use of mechanically cooled air mode, forcing only that AHU to use outside air for cooling, may present difficulty in immediately predicting whether condensation will occur, leaving the system potentially open to condensation. By contrast, having all AHUs switch to providing outside air can be confidently predicted to avoid condensation. Automating this response avoids having to handle each permutation of possible AHU failure scenarios for different ambient temperature and humidity conditions. AHU controllers and AHU supervisory controller can take further actions including notifications and throttling of compute workloads to remain within the cooling capacity of the AHUs being overridden to use outside air mode.

In one or more embodiments, the AHU supervisory controller disclosure can rely on empirical testing of conditions that yield a high possibility that the mix of mechanically cooled air with outside air could cause condensation in certain ambient temperature and humidity conditions. The determination can be made in response to detecting a failure of one AHU, prompting that AHU to go to outside air mode. The AHU supervisory controller can determine whether the sensed conditions and mode of operation of each AHU present a high possibility of condensation. The AHU supervisory controller then overrides only when the high possibility of condensation exists.

In one or more embodiments, the AHU supervisory controller can detect a particular set of conditions that is creating a risk of condensation even when each of the AHU controllers does not indicate a failure that forces use of outside air cooling. For example, the AHU supervisory controller can monitor air temperature and relative humidity within a common air passage that directs IT supply air. In response to the relative humidity being above a threshold, the AHU supervisory controller can trigger an override of all AHUs to change to outside air mode.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not other embodiments.

In one or more aspects of the present disclosure, a cooling system includes more than one AHU. Each AHU provides cooling air to at least one IT module or bank of IT modules within a LIHS, such as a data center having a plurality of IT modules arranged at different locations within a single contiguous interior space of the data center. Each AHU has one or more actuators that directs cooling air through the at least one IT module in a selected mode of operation from among: (i) an outside air mode; (ii) a mechanically cooled air mode; and (iii) a mixed air mode. An AHU controller is in communication with the one or more actuators to control the one or more actuators to direct the intake of cooling air in the selected mode of operation. An AHU supervisory controller is communicatively coupled with each AHU controller. The AHU supervisory controller executes a cooling mode override utility that enables the AHU supervisory controller to determine whether at least one AHU is operating in the outside air mode. In response to determining that at least one AHU within the data center is operating in the outside air mode, the cooling mode override utility enables the AHU supervisory controller to trigger any remaining AHU controllers to switch to the outside air mode. Having all AHUs using outside cooling air avoids condensation in the cooling air delivered to the at least one IT module.

According to aspects of the present innovation, an information handling system (IHS) includes at least one IT module within an enclosure. A cooling system of the IHS has more than one AHU that each provide cooling air to the at least one IT module. Each AHU has one or more actuators that directs cooling air from a selected one or both of: (i) an outside air source; and (ii) a mechanically cooled air source. An AHU controller is in communication with the one or more actuators to control the one or more actuators to direct the cooling air from the selected one or both of (i) the outside air source; and (ii) the mechanically cooled air source. An AHU supervisory controller is in communication with each AHU controller. The AHU supervisory controller executes a cooling mode override (CMO) utility that enables the AHU supervisory controller to determine whether at least one AHU is providing cooling air solely from the outside air source. In response to determining that at least one AHU is cooling air solely from the outside air source, the CMO utility enables the AHU supervisory controller to trigger any remaining AHU controllers to provide cooling air solely from the outside air source. Having all AHUs use outside cooling air avoids condensation in the cooling air delivered to the at least one IT module.

According to illustrative embodiments of the present disclosure, a method is provided for controlling multiple multimode AHUs that provide cooling air to respective IT modules of an his using one or both of: (i) an outside air source; and (ii) a mechanically cooled air source. The method includes monitoring a cooling mode of each of the multiple AHUs of the datacenter and determining whether at least one AHU has changed to outside air mode to provide cooling air solely from the outside air source. In response to determining that at least one AHU has changed modes to provide cooling air solely from the outside air source, the method includes triggering any remaining AHU not also operating in the outside air mode to switch to the outside air mode and provide cooling air from the outside air source, in order to avoid condensation in the cooling air delivered to the at least one IT module.

FIG. 1A is an isometric depiction of data center, and specifically a modular data center (MDC) 100. A cooling system 102 provides cooling air for rack-based IHSs 104 that are installed in IT modules 106a-106d. IT modules 106a-106d are mostly depicted in phantom lines and are hidden behind AHUs 108a-108d within the illustration of MDC 100. AHUs 108a-108d have a lower portion 110 that is positioned beside a respective one of IT modules 106a-106d to direct cooling air perpendicularly onto and over rack-based IHSs 104. The cooling air is directed in an alignment with exhaust fan air flow through each IHS 104 from cold aisle 112 to hot aisle 114 of IT modules 106a-106d. In one or more embodiments, all cooling air is forced to pass through IHSs 104, allowing removal of individual exhaust fans in each IHS 104. An upper portion 116 of each AHU 108a-108d returns cooling air that has passed through respective IT modules 106a-106d for exhausting or recirculating.

For clarity, four (4) AHUs 108a-108d and four (4) IT modules 106a-106d are illustrated. The features provided herein requires at least two AHUs, and the actual number of AHUs may be any number of two or more. Notably, while multiple connected modular IT modules 106a-106d are shown, aspects of the disclosure can be implemented with only one IT module, so long as multiple, independently controlled AHUs are present. For example, two AHUs may be directly mounted to an MDC having a single one or more modular IT modules. In at least one embodiment, MDC 100 is and/or is configured as an Expandable Modular Information Technology Building Infrastructure (EMITBI). Further, because of the relatively large scale of MDC 100 and the use of modular building blocks that house the IT modules 106a-106d within the MDC 100, the combination of IT modules 106a-106d that are cooled by AHUs 108a-108d are collectively referred to herein as a modularly-constructed, large-scale information handling system (LIHS).

AHUs 108a-108d are controlled by a MDC cooling control system 118. Each of AHUs 108a-108d is under the direct control of a respective AHU controller 120a-120d. In one or more embodiments, AHU supervisory controller 122 monitors and selectively overrides AHU controllers 120a-120d to ensure that cooling air provided in concert by AHUs 108a-108d to IT modules 106a-106d is within an acceptable temperature range to prevent condensation. In one or more embodiments, AHU controllers 120a-120d select a cooling mode based at least in part on dry bulb temperature sensors and relative humidity transducers, such as internal and outside dew point transducer(s) 124, 126 and internal and outside temperature transducer(s) 128, 130. In one or more embodiments, AHU supervisory controller 122 can select modes of operation for AHU controllers 120a-120d to implement. AHU supervisory controller 122 can select a mode that optimizes performance based on air measurements obtained from internal and external/outside dew point transducer(s) 124, 126 and internal and outside temperature transducer(s) 128, 130. In one or more embodiments, condensation can occur because air from different AHUs 108a-108d mix within IT modules 106a-106d. In one or more embodiments, condensation can occur because certain surfaces are conductively cooled by an adjacent AHU 108a-108d that is performing mechanical cooling and simultaneously convectively cooled by another AHU 102a-102d that impinges warm and/or humid outside air on the same surface. Condensation could damage rack-based IHSs 104 within IT modules 106a-106d. In one or more embodiments, AHU supervisory controller 110 executes a cooling mode utility 132 to monitor and routinely select modes of operation or selectively override a mode selected by AHU controllers 120a-120d.

Within the general context of IHSs, rack-based IHSs 104 may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an IHS may be a personal computer, a PDA, a consumer electronic device, a network storage device, or any other suitable device and may vary in size, shape, performance, functionality, and price. The IHS may include memory, one or more processing resources such as a central processing unit (CPU) or hardware or software control logic. Additional components of the IHS may include one or more storage devices, one or more communications ports for communicating with external devices as well as various input and output (I/O) devices, such as a keyboard, a mouse, and a video display. The IHS may also include one or more buses operable to transmit communication between the various hardware components.

Figure 1B:
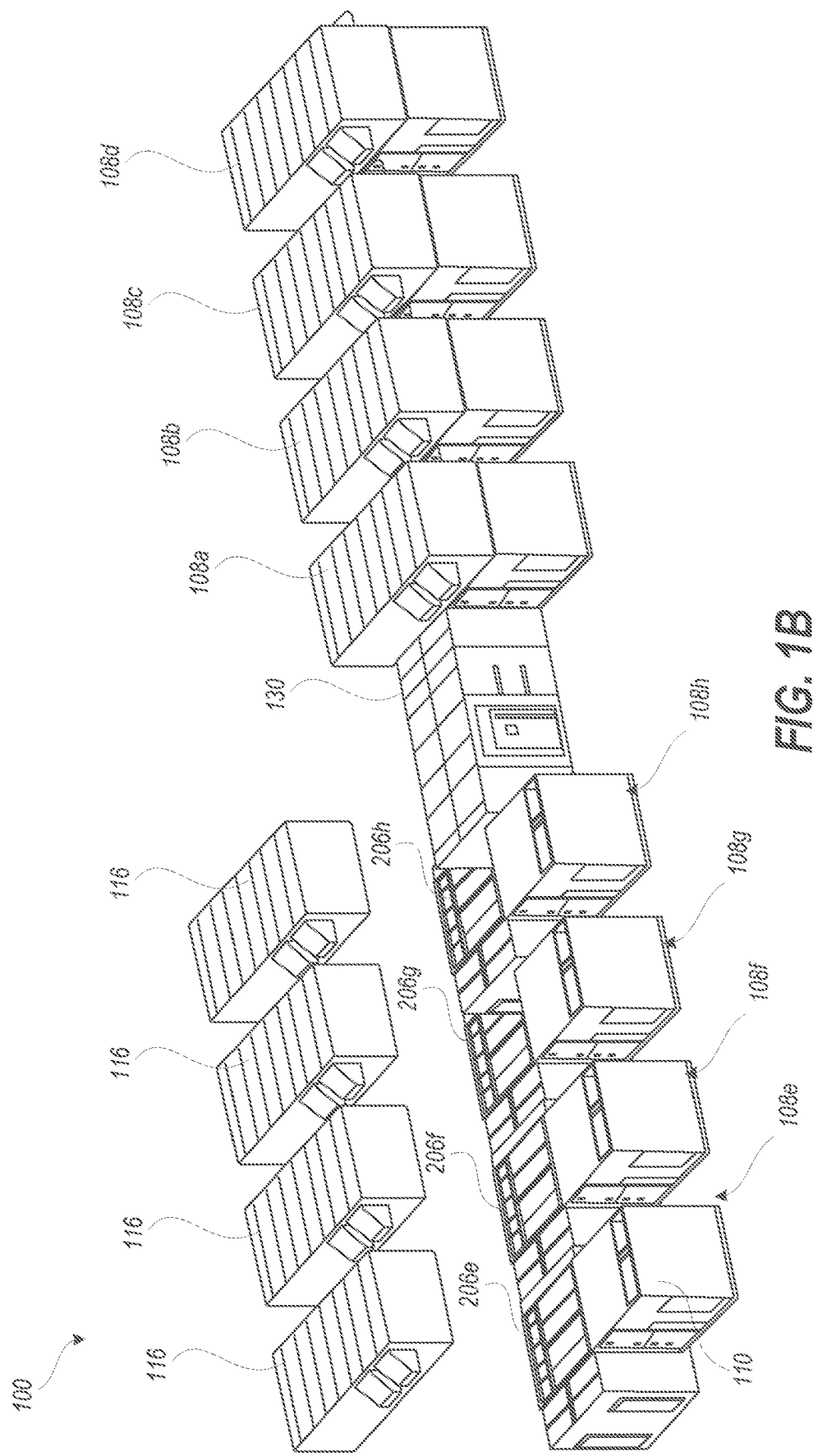
FIG. 1B is an isometric partially exploded 3D depiction of the MDC expanded via a utility room with four additional information technology (IT) modules, according to one or more embodiments.

FIG. 1B is an isometric partially exploded 3D depiction of the MDC 100 expanded via a utility room 130 that provides functional support for four (4) additional IT modules 106e-106h and AHUs 108e-108h. Utility room 130 can include IT equipment and gear such as power distribution and communication switching that connects internally within MDC 100 and externally to other functional entities.

Figure 2:
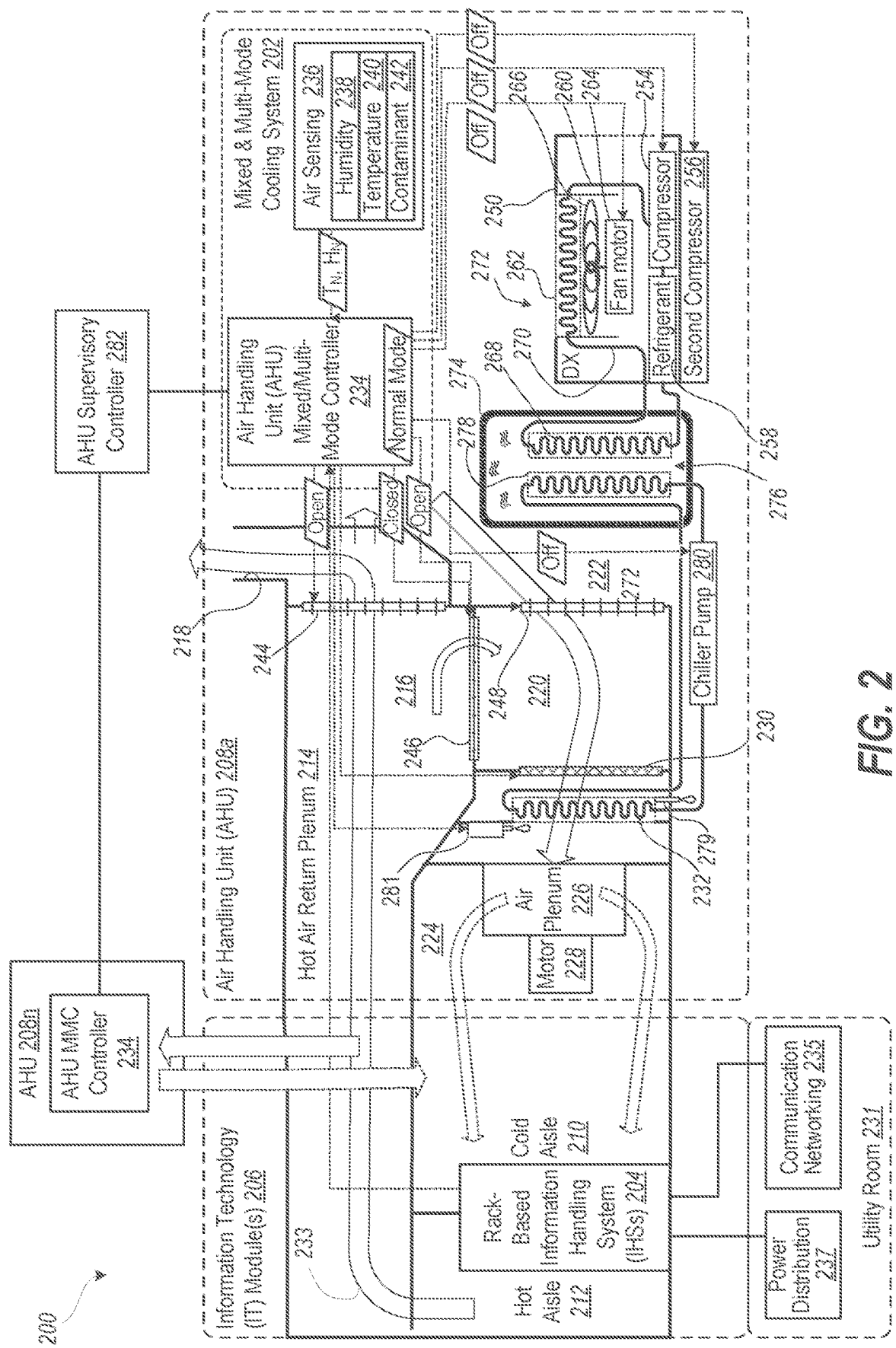
FIG. 2 is a block diagram representation of functional components within an example data center having a direct expansion (DX) cooling system that performs mixed cooling modes with an AHU supervisory controller, according to one or more embodiments.
Figure 3:
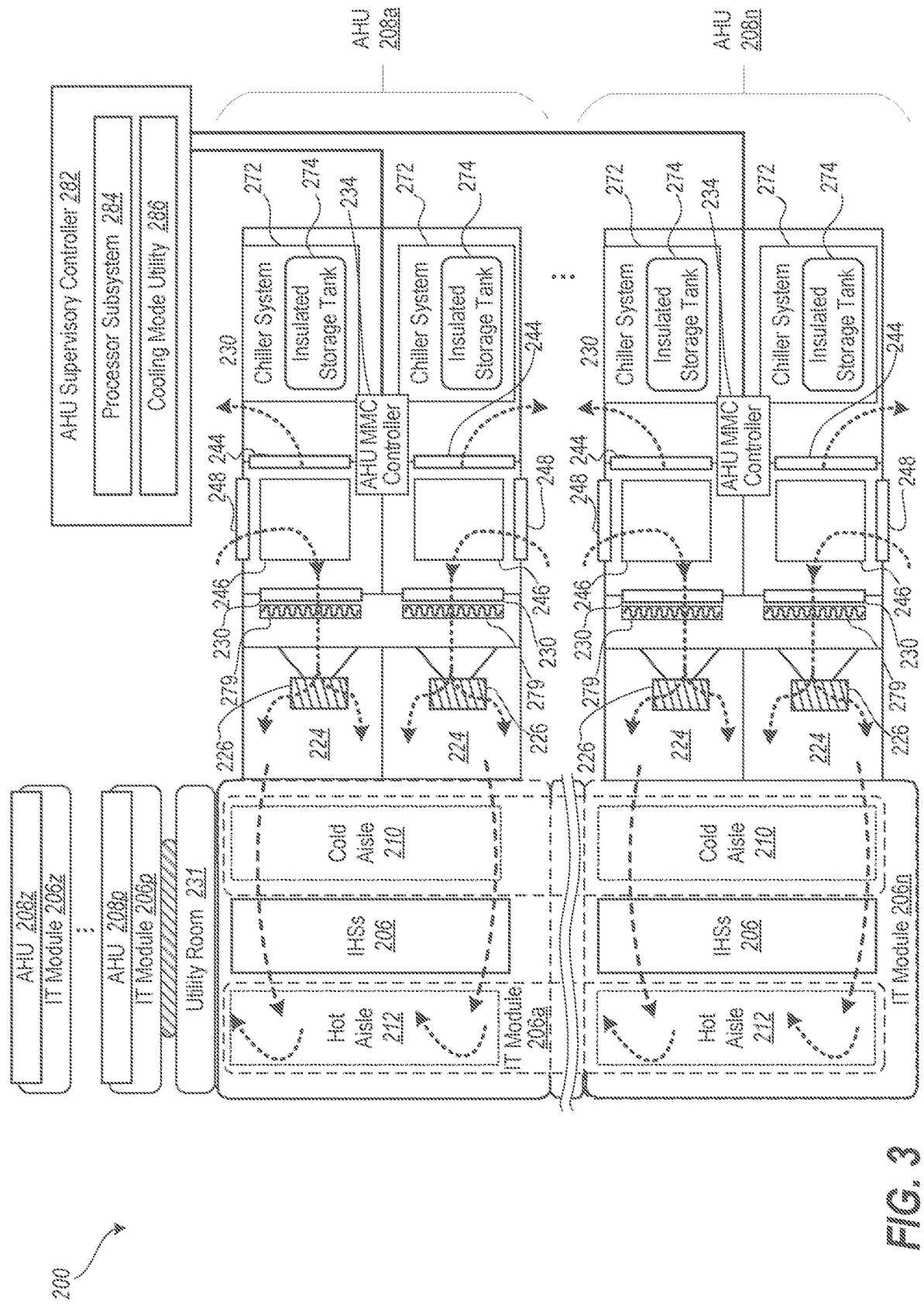
FIG. 3 is a block diagram representation of the example data center having the DX cooling system with paired AHUs, according to one or more embodiments.

FIGS. 2-3 are block diagram representations of an example data center 200 having a direct expansion (DX) cooling system 202 that can reduce energy costs by expanding use of outside air for cooling using a selected one of open mode, mixed mode, multi-mode, and closed mode. The term mixed mode refers to using recirculated air (e.g., IT return air within hot aisle 212 of IT blocks/modules 206) to warm outside air that is otherwise too cold (or too humid). Multi-mode refers to performing mechanical cooling while using outside cooling air, via a process referred to herein as mechanical trimming. The expanded use of outside air includes partial use of outside air even when the outside temperature and the outside humidity are not within an acceptable range for IHSs 204 within IT module 206 of data center 200. In one embodiment, DX cooling system 202 directly controls AHUs 208a, 208n that provide cooling to at least one IT module 206 within modular data center 200.

Data center 200 includes IT module 206 having a row of rack-mounted IHSs 204 that separate cold aisle 210 from hot aisle 212. Cold aisle 210 is the cooling air intake aisle that receives IT supply air. Hot aisle 212 is the cooling air return aisle that receives IT return air that has passed over and/or through the rack-mounted IHSs 204. Hot aisle 212 is in fluid communication with hot air return plenum 214. AHU 208a includes return chamber 216 that is in fluid communication with hot air return plenum 214. AHU 208a includes an exhaust portal, such as, but not limited to, exhaust chimney 218, which is in in fluid communication with return chamber 216. AHU 208a includes intake chamber 220 that is fluid communication with return chamber 216 and outside environment 222. In one embodiment, exhaust chimney 218 mitigates warmed air from being drawn into intake chamber 220. However, in one embodiment, an exhaust portal can be flush mounted, relying on spacing to prevent inadvertent recirculation. It is appreciated that the outside environment encompasses some or all of the exterior of AHU 208a and data center 200, and the specific location illustrated within FIG. 2 only references one location adjacent/relative to intake chamber 220 for simplicity in describing the intake process of external air. AHU 208a includes an air mover to move air through IT module 206. Specifically, AHU 208a includes outlet chamber 224 that is uniformly pressurized by air plenum blower 226 driven by motor 228. Air plenum blower 226 pulls air in axially and sprays it out radially within an enclosed space to pressurize evenly. Air plenum blower 226 draws air from intake chamber 220 through contaminant filter 230 and chiller coil 232. With particular reference to FIG. 2, the pressurized air in outlet chamber 224 exits AHU 208a and enters cold aisle 210 of IT module 206. Hot air return plenum 214 receives IT return air flow path 233 from hot aisle 212. Utility room 231 contains functional support to data center 200 including communication network equipment 235 and power distribution equipment 237.

AHU 208a can be configured for a mode of cooling that is appropriate for the outside ambient conditions. In one or more embodiments, AHU 208a can be configured by DX cooling system 202 for one of (1) an open mode or outside air mode, (2) a mixed mode, (3) a multi-mode, and (4) a closed mode. The four modes of operation are further grouped based on whether mechanical cooling is used or not. Mechanical cooled air mode includes: (i) multi-mode using mechanical trimming with some mechanically cooled air; and (ii) closed mode using only mechanically cooled air. Outside air mode as used herein is when mechanical cooling is not used and includes: (iii) open mode; and (iv) mixed mode. Open mode as used herein refers to solely using outside air cooling without recirculation. Open mode includes using outside air for cooling due to failure of mechanical cooling. Alternatively, open mode includes a normal mode when outside air for cooling is used for economy when mechanical cooling is operational but not used. Mixed mode refers to recirculating a portion of IT return air to warm cooling air such that the resulting IT supply air is above a minimum dry bulb temperature or reduces a relative humidity.

FIG. 2 illustrates AHU 208a having AHU mixed and multi-mode cooling (MMC) controller 234 that is responsive to air sensing components 236. Air sensing components 236 can include, but are not limited to, humidity sensor 238, temperature sensor 240, and gas/liquid/solid contaminant sensor 242. When air sensing components 236 indicate that the ambient temperature of the exterior air is within an acceptable (or normal) range ($T_N$) and that the humidity of the exterior air is also within an acceptable range ($H_N$), AHU MMC controller 234 configures AHU 208a for open mode cooling, which involves using only the outside air for cooling of the IHSs. Exhaust damper 244 is opened between return chamber 216 and exhaust chimney 218 to allow the exhaust air to exit AHU 208a. Simultaneously or concurrently, recirculation damper 246 is closed between return chamber 216 and intake chamber 220 to prevent recirculation of the exhaust air. Outside air intake damper 248 is opened, allowing outside air from outside environment 222 to enter AHU 208a. In open mode, DX cooling unit 250 that supports AHU 208a remains off.

Within FIGS. 2-3, DX cooling unit 250 includes first compressor 254 and second compressor 256 for stepped performance. Compressors 254, 256 compress and move compressed (liquid) refrigerant on a high side from refrigerant tank 258 through discharge line 260 and through condenser coil 262. Condenser fan motor 264 drives condenser fan 266 to move condensing air through condenser coil 262. The condensing air convectively removes heat generated during compression from the refrigerant. An expansion device (not shown) downstream of condenser coil 262 causes expansion cooling by creating a pressure loss between the high and low sides of DX cooling unit 250. Evaporator coil 268 transfers heat from its ambient environment to the refrigerant that is then pulled from suction line 270 back to refrigerant tank 258. In one embodiment, chiller system 272 operates between DX cooling unit 250 and AHU 208a. Chiller system 272 enables more efficient utilization of DX cooling system 250, avoiding short cycling of compressor 254. DX cooling unit 250 chills water in insulated storage tank 274 that is cooled by evaporator coil 268. Chiller system 272 then includes heat exchanger 276 that includes evaporator coil 268 and heat sink coil 278 in insulated storage tank 274. AHU MMC controller 234 activates chiller pump 280 to move coolant such as water through chiller coil 232 and heat sink coil 278. Compressor 254 can operate for a period of time that is efficient with insulated storage tank 274 supplying an amount of cooling as needed by pumping at a determined flow rate.

DX cooling unit 250 can serve as dehumidifier with condensation on chiller coil 232 being guided by a water drain 279 out of AHUs 208a. Thereby, outside humidity that is above the acceptable range, or would become too high during a multi-mode operation, can be removed. In addition, in one embodiment, MMC cooling system 202 can include humidifier 281 that increases the level of humidity in the moderated outside air by adding moisture.

AHU MMC controller 234 is in communication with the one or more actuators to control the one or more actuators to direct the cooling air from the selected one or both of (i) the outside air source; and (ii) the mechanically cooled air source (i.e., chiller system 272). AHU supervisory controller 282 includes processor subsystem 284 that is in communication with each AHU MMC controller 234. Processor subsystem 282 executes a CMO utility 286 that enables the AHU supervisory controller 282 to provide the following functionality: (i) determine whether at least one AHU 208a, 208n is providing cooling air solely from the outside air source; (ii) in response to determining that at least one AHU 208a, 208n is providing cooling air solely from the outside air source, trigger any remaining AHU controllers 208a, 208n that are not currently operating in open mode (i.e., outside air mode providing only outside air for cooling) to change to open mode (i.e., outside air mode) and provide cooling air from only the outside air source to avoid condensation in the cooling air delivered to the at least one IT module 206.

FIG. 3 illustrates a top view of the MDC 200 illustrating that each AHU MMC controller 234 may control a respective AHU 208a, 208n having a bifurcated arrangement of air flow paths and actuators. AHU 208a, 208n include left and right sets of actuators that control the opening and/or closing of exhaust, recirculation, and intake dampers 244, 246, 248, and left and right sets of mechanical-cooled air subsystems (i.e., chiller system 272). The bifurcated arrangement provides redundancy and increased cooling performance levels. For clarity only two AHUs 208a, 208n are depicted with respective direct coupling to IT modules 206a, 206n, although more AHUs 208a, 208n can be used. In one or more embodiments, outlets 224 of each AHUs 208a, 208n direct air flow in parallel alignment. The air flow is orthogonal to the cold aisle 210 of the one or more IT modules 206a, 206n, respectively, to direct cooling air perpendicularly to the rack-based IHSs 206. The air flow is in alignment with exhaust air movement through rack-based IHSs 204. Utility room 231 is placed between IT module 206a and upgrade IT modules 206p, 206z, which have their own AHUs 208p, 208z.

Figure 4:
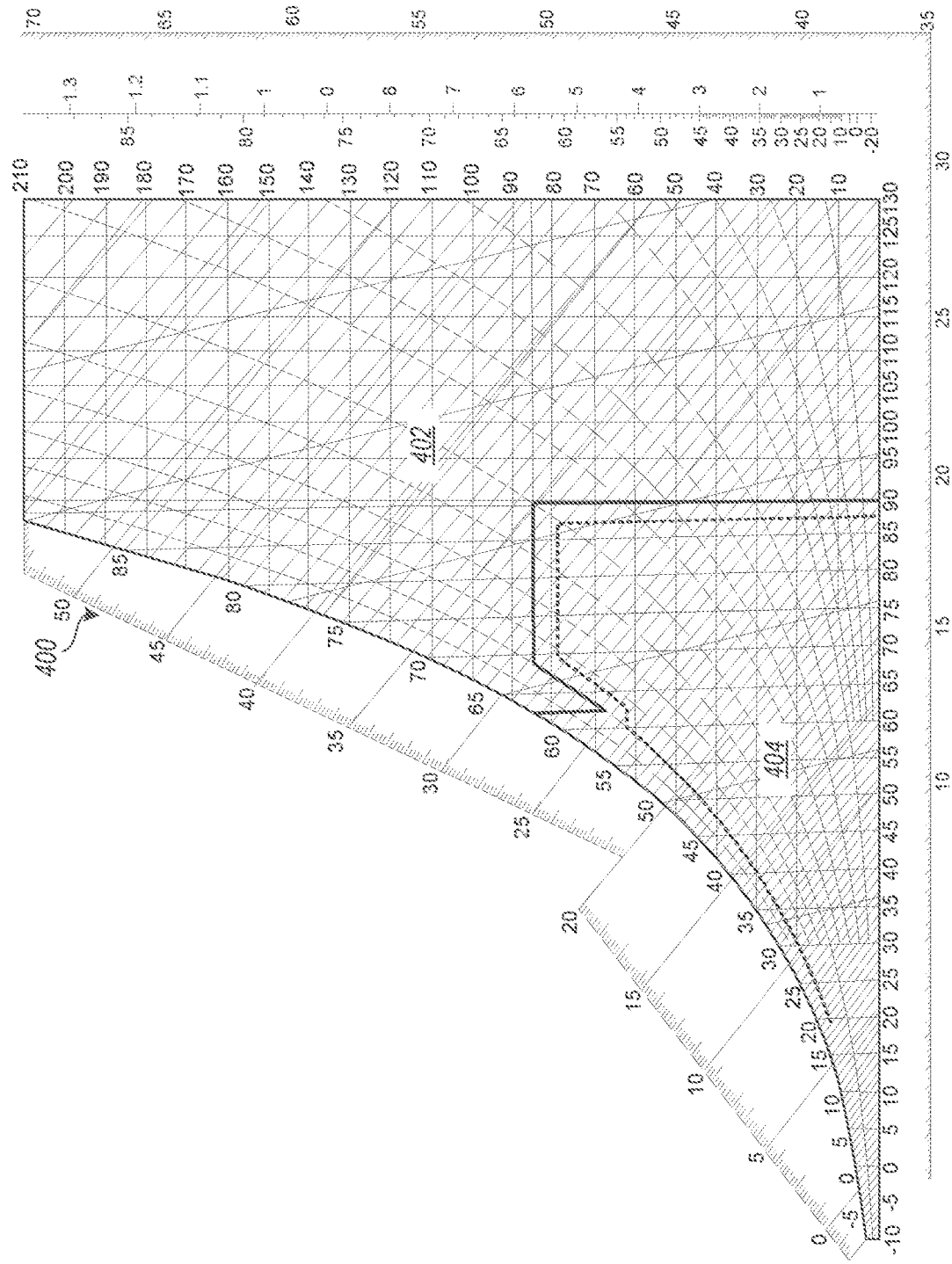
FIG. 4 is graphical representation of a psychrometric chart defining modes of operation implemented by an AHU controller, according to one or more embodiments.

FIG. 4 is graphical illustration/representation of a psychrometric chart 400 implemented by an AHU controller. Psychrometric chart 400 is annotated for a humid and hot zone 402 for which DX mode is appropriate and for a cool and dry zone 404 for which a mix mode using outside air is appropriate.

Figure 5:
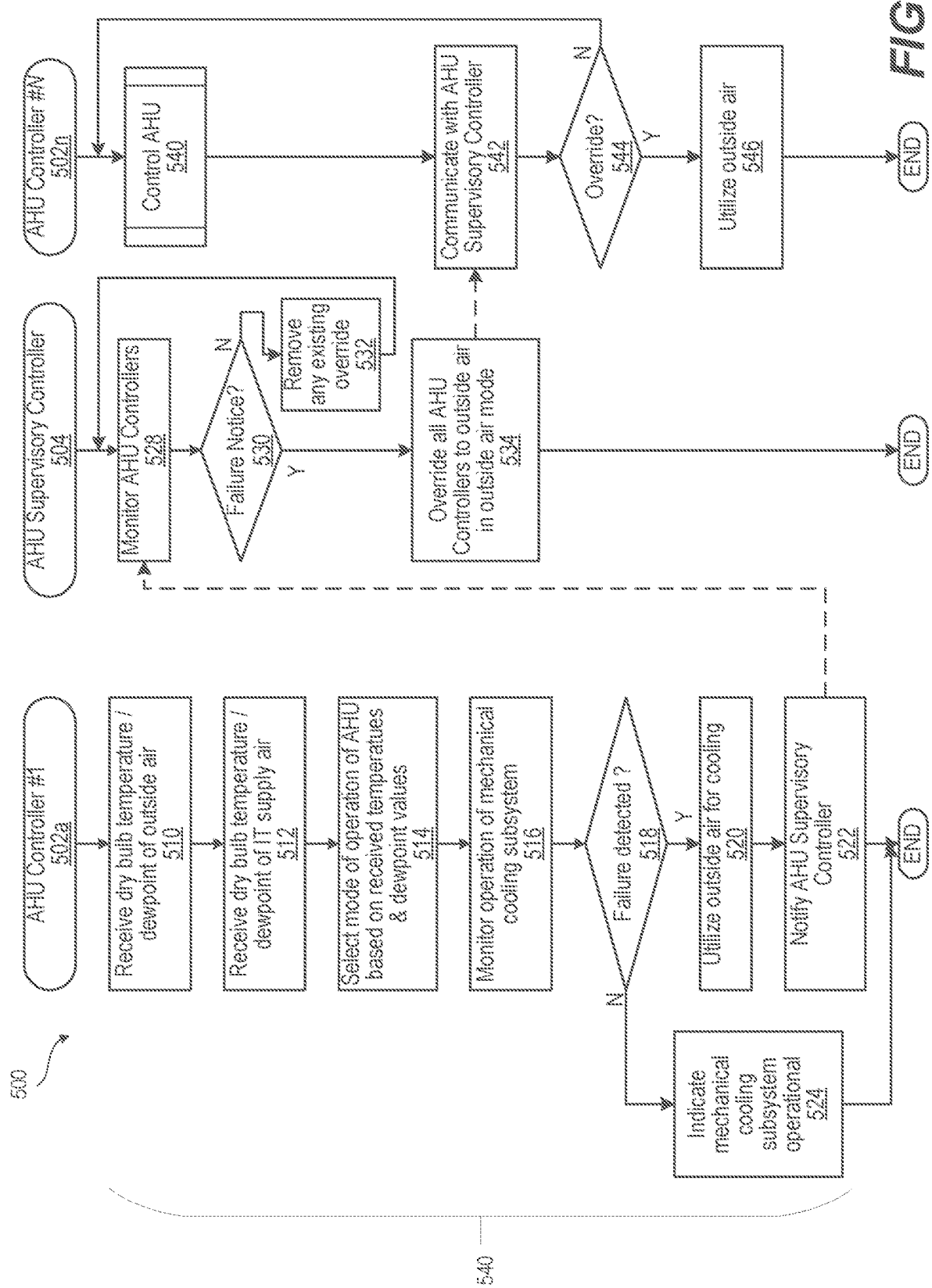
FIG. 5 is a timing diagram illustrating a distributed control system of AHU controllers and an AHU supervisory controller, according to one or more embodiments.

FIG. 5 is a sequence diagram illustrating a distributed control system 500 performed by at least two AHU controllers, represented by AHU controllers #1-N 502a-502n, and AHU supervisory controller 504. AHU controller #1 502a receives values for dry bulb temperature and dew point of outside air from (block 510). AHU controller #1 502a receives values for dry bulb temperature and dew point of IT supply air (block 512). AHU controller #1 502a selects mode of operation of AHU based on received temperatures and dew point values (block 514). AHU controller #1 502a monitors operation of mechanical cooling subsystem (block 516). A determination is made whether a failure of the mechanical cooling subsystem is detected (decision block 518). In response to a failure being detected, AHU controller #1 502a causes the AHU to cool using outside air (i.e., open mode) without any mechanical cooling (block 520). AHU supervisory controller is notified of the failure (block 522). In response to a failure not being detect in decision block 518, AHU controller #1 502a provides an indication that the respective mechanical cooling subsystem is operational (block 524).

AHU supervisory controller 504 monitors AHU controllers #1-N 502a-502n (block 528). AHU supervisory controller 504 determines whether a failure notice is received (decision block 530). In response to not receiving a failure notice, AHU supervisory controller 504 removes any override to AHU controllers #1 and #N 502a, 502n that were previously set (block 532). Processing by AHU supervisory controller 504 returns to block 528 to continue monitoring. In response to receiving the failure notice in decision block 528, AHU supervisory controller 504 transmits an override to all AHU controllers, to trigger the AHU controllers to change operation to cooling IHSs with only outside air in an outside air (or open) mode (block 534).

AHU controller #N 502n also controls a respective AHU (block 540). AHU controller #N 502n communicates with AHU supervisory controller (block 542). AHU controller #N 502n determines whether an override command is received from AHU supervisory controller (block 544). In response to determining that an override command is not received, processing returns to block 540 to continue controlling the respective AHU based on locally detected conditions and AHU settings. In response to determining that an override command is received, AHU switches to open mode cooling and utilizes only outside air for cooling (block 546).

For clarity, FIG. 5 illustrates AHU controller #1 502a detecting a failure and AHU supervisory controller 504 responding by overriding a mode of operation of AHU controller #N 502n. Distributed control system 500 can have more AHU controllers that dynamically update AHU supervisor controller 504 with an operational condition of a particular AHU. For example, a maintenance action can change a mechanical cooling subsystem from a failed condition to an operational condition. In response to detecting that one AHU controller #1 502a is no longer limited to outside air mode, AHU supervisory controller 504 can remove the override to all AHU controllers #1, #N 502a, 502n. In response, AHU controllers #1, #N 502a, 502n would resume determining what mode of operation is appropriate based on outside and internal temperatures and relative humidity. The mode of operation can further be based on compute loads that require cooling, minimum and maximum temperature limits for IT gear cooled by the cooling system controlled by the distributed cooling system 500. In one or more embodiments, configuration of the cooling system provided by respective AHUs is such that each AHU under independent control by AHU controllers #1, #N 502a, 502n will generally operate in the same mode of operation absent a failure that forces outside air mode.

Figure 6A:
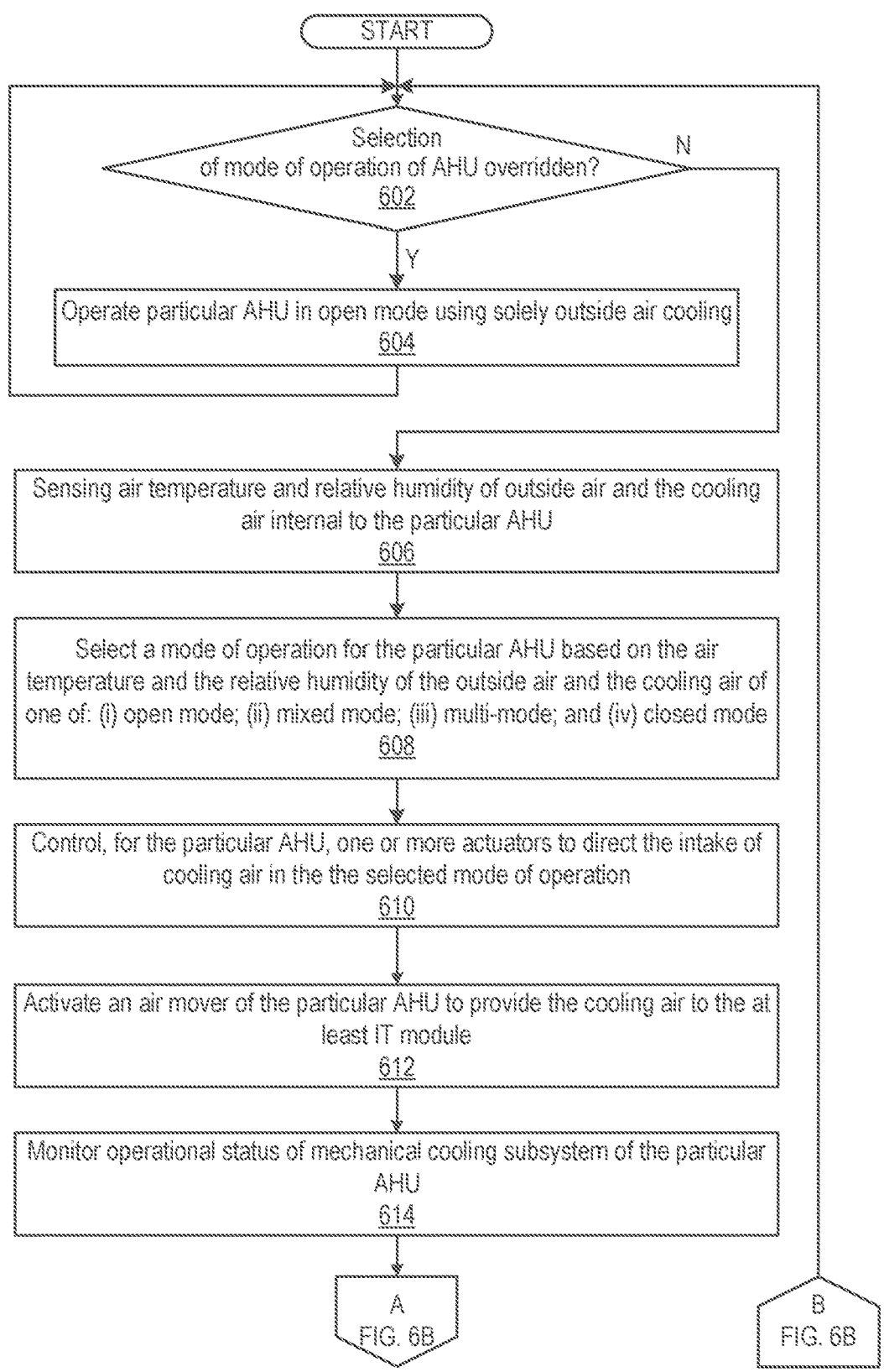
FIGS. 6A-6B are a flow diagram illustrating a method of controlling operational modes of an AHU based on measured temperatures and relative humidity and received override commands from a supervisory AHU controller, according to one or more embodiments.
Figure 6B:
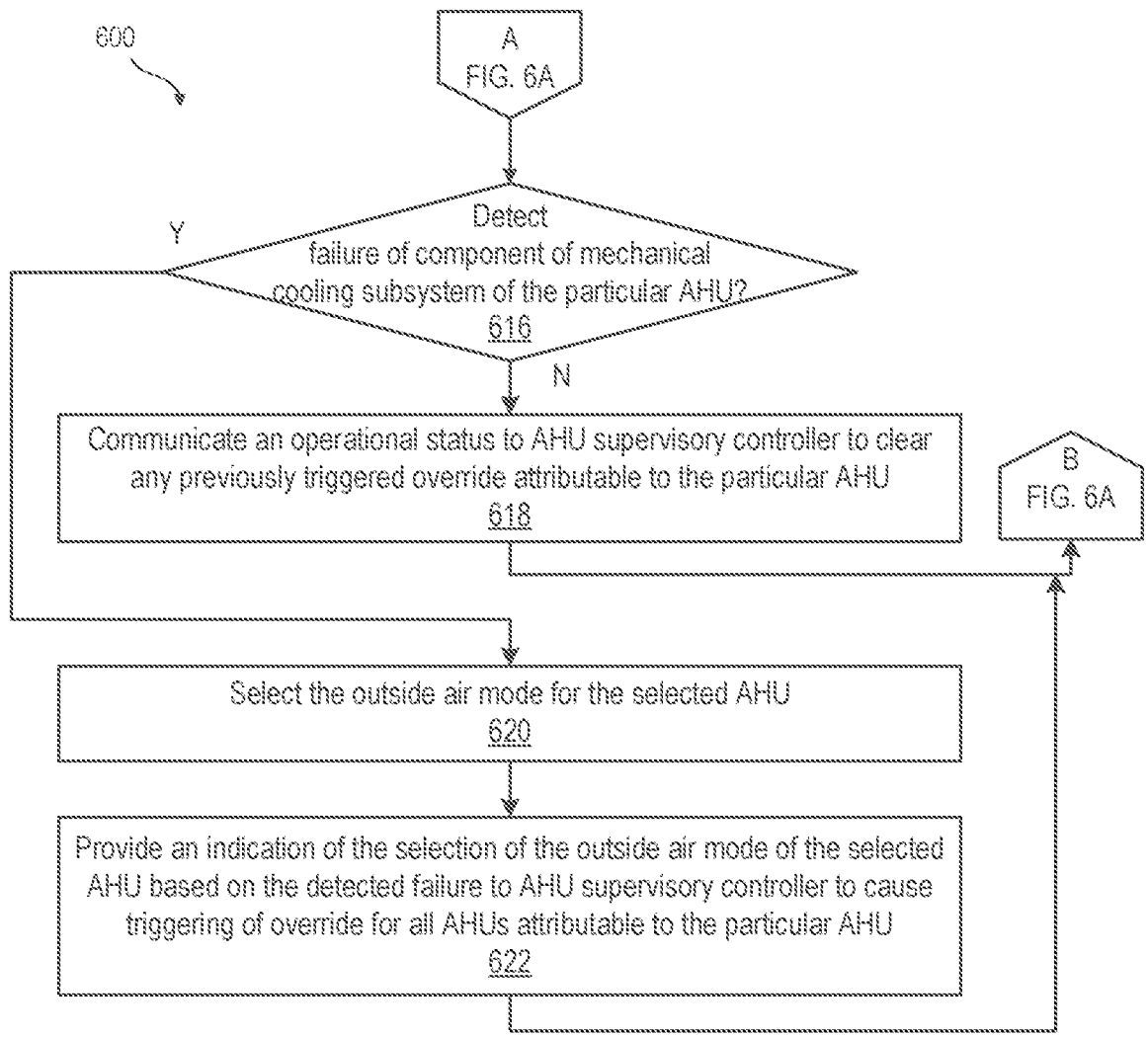

FIGS. 6A-6B are a flow diagram illustrating a method 600 of independently operating a cooling process of a particular AHU within a cooling system of an IHS having multiple independently operated AHUs. The cooling process of the particular AHU is operated so that condensation is prevented within the IHS. Method 600 begins with AHU controller determining whether AHU controller receives a communication or signal indicating that local selection of a mode of operation of the particular AHU of the cooling system is overridden by AHU supervisory controller 110 (FIG. 1A) (decision block 602). As described herein, AHU supervisory controller 110 (FIG. 1A) triggers the override in response to detecting (or receiving notification) that another AHU of the cooling system is providing cooling air solely from an outside air source. In one or more embodiments, open mode (i.e., outside air mode) can be a normal mode of operation when permitted by sensed conditions. Generally, open mode requires a low amount of power as compared to activating any mechanical cooling subsystems in closed or multi-modes. Open mode using solely outside air cooling can also be a default mode used in response to a failure of a mechanical cooling subsystem. Returning to the flow chart, in response to determining that selection of a mode of operation of the particular AHU is overridden in decision block 602, method 600 includes operating the particular AHU in open mode using solely outside air cooling (block 604). Method 600 returns to block 602 to monitor for a change to the override of mode selection.

In response to determining at decision block 602 that local selection of a mode of operation of the particular AHU is not overridden by AHU supervisory controller 110 (FIG. 1A), method 600 includes sensing, via transducers 124, 126, 128, 130 associated with the particular AHU controller (108a-108d, FIG. 1A), air temperature and relative humidity of outside air and the cooling air internal to the particular AHU (block 606). Method 600 includes selecting a mode of operation for the particular AHU based on the air temperature and the relative humidity of the outside air and the cooling air. Method 600 selects from one of: (i) an open mode; (ii) mixed mode; (iii) multi-mode; and (iv) closed mode (block 608). Method 600 includes controlling, for the particular AHU, one or more actuators to direct the intake of cooling air in the selected mode of operation (block 610). Method 600 includes activating an air mover of the particular AHU to provide the cooling air to the at least IT module (block 612).

AHU controller 108a-108d (FIG. 1A) monitors operational status of mechanical cooling subsystem of the particular AHU (block 614). A determination is made as to whether a failure is detected of a component of a mechanical cooling subsystem of the particular AHU (decision block 616). In response to not detecting a failure of a component of the mechanical cooling subsystem, AHU controller 108a-108d can communicate an operational status to AHU supervisory controller 110 (FIG. 1A) to clear any previously triggered override attributable to the particular AHU (block 618). Then method 600 returns to block 602 and AHU controller continues selecting the appropriate mode of operation for the particular AHU. In response to detecting the failure of the component of the mechanical cooling subsystem in decision block 616, method includes selecting the outside air mode for the selected AHU, if the outside air mode has not already been selected (block 620). AHU controller 108a-108d can provide an indication to AHU supervisory controller 110 (FIG. 1A) of the selection of the outside air mode of the particular AHU based on the detected failure (block 622). As described herein, the indication is provided to AHU supervisory controller 110, and AHU supervisory controller 110 then triggers an override to open mode operation for all AHUs. Then method 600 returns to block 602 to continue selecting appropriate a mode of operation for the particular AHU.

Figure 7:
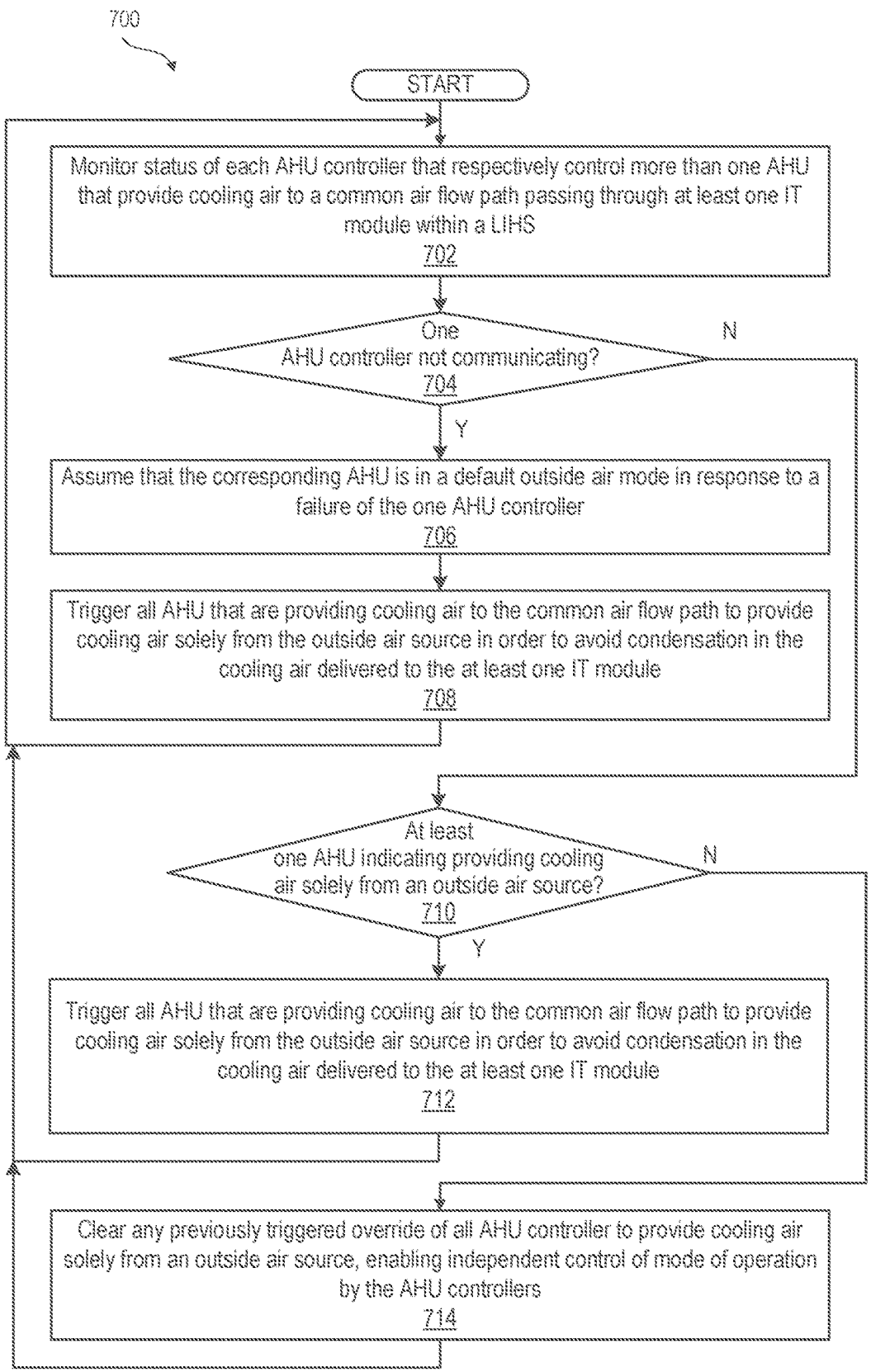
FIG. 7 is a flow diagram illustrating a method of supervising multiple AHUs that provide mixed mode cooling air to IHSs so that condensation is prevented, according to one or more embodiments.

FIG. 7 is a flow diagram illustrating a method 700 of supervising cooling processes within a cooling system of an IHS having multiple independently operated AHUs and an AHU supervisory controller so that condensation caused by different modes of operations across the multiple AHUs is substantially prevented from occurring within the IHS. Method 700 begins by monitoring an cooling mode status of each AHU controller of more than one AHUs that provide cooling air to a common air flow path passing through at least one information technology (IT) module within a large-scale information handling system (LIHS) (block 702). AHU supervisory controller determines whether one AHU controller is not communicating (decision block 704). In response to determining that the one AHU controller is not communicating, AHU supervisory controller assumes that the corresponding AHU or AHU controller is in a failure state, which also causes the particular AHU to operate in a default outside air mode (block 706). In response to that detection, method 700 includes triggering all AHUs that are providing cooling air to the common air flow path to provide cooling air solely from the outside air source, in order to avoid condensation in the cooling air delivered to the at least one IT module (block 708). Then method 700 returns to block 702 to monitor communication with AHU controllers 108a-108d (FIG. 1A).

In response to determining that all AHU controllers are communicating in decision block 704, method 700 includes determining whether at least one AHU has changed cooling modes to an open mode, providing cooling air solely from an outside air source (decision block 710). In one embodiment, the change to the open mode is triggered by a fault condition of a mechanical cooling subsystem of the AHU. In response to at least one AHU controller indicating that a corresponding AHU is providing cooling solely from an outside air source, AHU supervisory controller 110 (FIG. 1A) triggers all AHU controller to change to the open air mode and provide cooling air solely from an outside air source (block 712). Then method 700 returns to block 702 where the AHU supervisory controller 110 continues to monitor communication with AHU controllers 108a-108d (FIG. 1A). In response to no AHU controller indicating that a corresponding AHU is providing cooling solely from an outside air source, AHU supervisory controller 110 (FIG. 1A) clears any previously triggered override of all AHU controller to provide cooling air solely from an outside air source, enabling the AHU controllers to resume independent control of their cooling modes (block 714). Then method 700 returns to block 702 to monitor communication with AHU controllers 108a-108d for any change in operational status (FIG. 1A).

In one or more embodiments, an AHU supervisory controller can have access to sensed data regarding temperature and relative humidity outside of the data center served by the AHUs. Method 700 can include detecting, by the AHU supervisory controller, an outside air temperature and relative humidity of an outside air source. Method 700 can include detecting, by the AHU supervisory controller, an internal temperature and relative humidity of the cooling air internal to a particular AHU. Method 700 can include triggering all AHU controllers to operate in outside air mode in further response to determining that mixing of cooling air from the AHUs operating in different modes of operation will cause condensation in the IT module, based at least in part on the outside and internal air temperatures and the outside and internal relative humidities. In other embodiments, AHU supervisory controller can prevent condensation in the IT module by defaulting to outside air mode for all AHUs when any one AHU is in outside air mode.

In one or more embodiments, method 700 includes determining, by an AHU supervisory controller, whether a trigger condition exists that indicates a risk of vapor condensation in at least one IT module within a LIHS that is cooled by more than one AHU. Each AHU directs the intake of cooling air in a selected mode of operation from among: (i) an outside air mode; and (ii) a mechanically cooled air mode. In response to determining that the trigger condition exists, the AHU supervisory controller triggers all AHUs to operate in a mode of operation selected to avoid vapor condensation in the LIHS. In particular embodiments, method 700 further includes, based on the internal and outside air temperatures and dew points, independently determining, by a respective AHU controller, the mode of operation of a respective AHU that avoids vapor condensation. Each AHU controller configures the respective AHU in the independently determined mode of operation in response to determining that the AHU supervisory controller is not overriding the independently determined mode of operation. Each AHU controller configures the respective AHU in the specified mode of operation by the AHU supervisory controller in response to determining that the AHU supervisory controller is overriding the independently determined mode of operation.

In one or more embodiments, method 700 includes detecting a failure of a component of a mechanical cooling subsystem of a selected AHU. In response to detecting the failure of the component of the mechanical cooling subsystem, method 700 includes: (i) configuring the selected AHU for the outside air mode; and (ii) providing an indication of the selection of the outside air mode based on the detected failure to the AHU supervisory controller. Method 700 includes determining, by the AHU supervisory controller, that the at least one AHU controller is operating in the outside air mode by the AHU supervisory controller based on receiving the indication of the detected failure.

In one or more embodiments, the outside air mode comprises: (i) an open mode using solely outside air for cooling; and (ii) mixed mode that includes outside air and recirculated air for cooling. The mechanically cooled air mode comprises: (iii) a closed mode that mechanically cools recirculated air for cooling; and (iv) a multi-mode that mechanically cools a combination of outside and recirculated air.

In one or more embodiments, method 700 includes determining by the AHU supervisory controller that the trigger condition exists based on the internal temperature and dew points. Method 700 includes determining a failure of the one or more AHU controller that are independently determining mode of operation based on determining that the trigger condition exists. In response to determining the failure based on internal temperature and dew point, method 700 includes triggering all AHUs to operate in an open mode of operation that is selected to avoid condensation.

Figure 8:
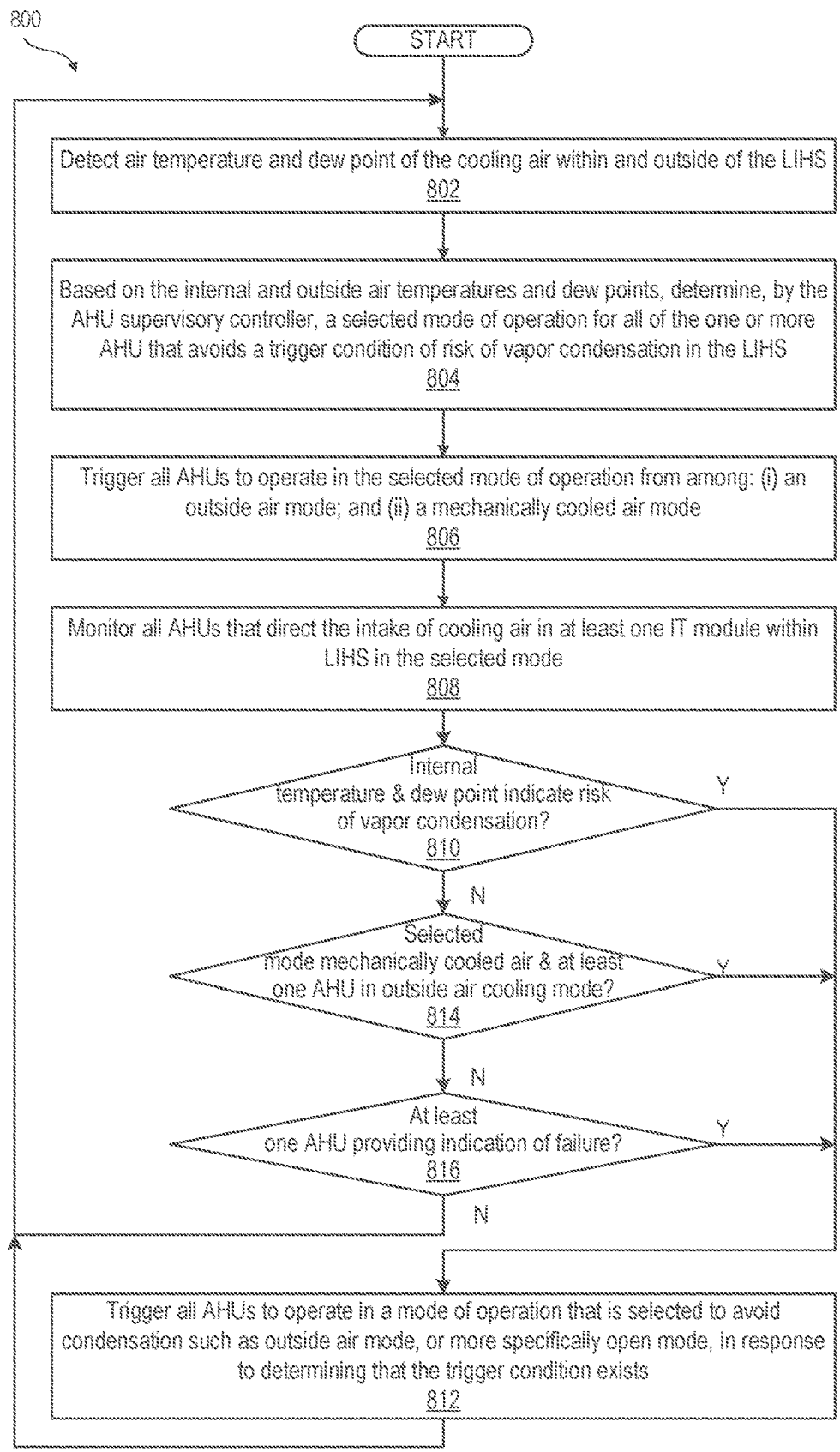
FIG. 8 is a flow diagram illustrating a method of an AHU supervisory controller selecting modes of operation of more than one AHU of an LIHS according to one or more embodiments.

FIG. 8 is a flow diagram illustrating a method 800 of an AHU supervisory controller selecting modes of operation of more than one AHU of an LIHS. Method 800 begins detecting air temperature and dew point of the cooling air within and outside of the LIHS (block 802). Based on the internal and outside air temperatures and dew points, method 800 includes determining, by the AHU supervisory controller, the selected mode of operation for all of the one or more AHU that avoids a trigger condition of risk of vapor condensation in the LIHS (block 804). Method includes triggering all AHUs to operate in the selected mode of operation from among: (i) an outside air mode; and (ii) a mechanically cooled air mode (block 806). Method 800 includes monitoring all AHUs that direct the intake of cooling air in at least one IT module within LIHS in the selected mode (block 808). A determination is made whether a trigger condition exists, such as the internal temperature and dew point indicating a risk of vapor condensation in the LIHS (decision block 810). In response to determining that the internal temperature and dew point indicate risk of vapor condensation in the LIHS, method 800 includes triggering all AHUs to operate in a mode of operation that is selected to avoid condensation, such as outside air mode, or more specifically open mode (block 812). Then method 800 returns to block 802 to continue selecting modes of operation for all AHUs of the LIHS.

In response to determining that the internal temperature and dew point do not indicate risk of vapor condensation in the LIHS in decision block 810, method 800 includes determining whether the selected mode is mode mechanically cooled air and whether at least one AHU is in outside air cooling mode (decision block 814). In response to determining that both: (i) the selected mode is mechanically cooled air mode; and (ii) at least one AHU is in outside air cooling mode, method 800 returns to block 812 to trigger all AHUs to operate in a mode of operation that is selected to avoid condensation. Method 800 subsequently returns to block 802 to continue selecting modes of operation for all AHUs of the LIHS.

In response to determining either the selected mode is not mechanically cooled air mode or that no one AHU is in outside air cooling mode in decision block 814, method 800 includes determining whether at least one AHU is providing an indication of a failure (decision block 816). In response to determining that at least one AHU is providing an indication of failure, method 800 returns to block 812 to trigger all AHUs to operate in a mode of operation that is selected to avoid condensation. Method 800 subsequently returns to block 802 to continue selecting modes of operation for all AHUs of the LIHS.

In the above described timing and flow diagrams of FIGS. 5, 6A-6B, 7, and 8, one or more of the methods may be embodied in an automated controller that performs a series of functional processes. In some implementations, certain steps of the methods are combined, performed simultaneously or in a different order, or perhaps omitted, without deviating from the scope of the disclosure. Thus, while the method blocks are described and illustrated in a particular sequence, use of a specific sequence of functional processes represented by the blocks is not meant to imply any limitations on the disclosure. Changes may be made with regards to the sequence of processes without departing from the scope of the present disclosure. Use of a particular sequence is therefore, not to be taken in a limiting sense, and the scope of the present disclosure is defined only by the appended claims.

One or more of the embodiments of the disclosure described can be implemented, at least in part, using a software-controlled programmable processing device, such as a microprocessor, digital signal processor or other processing device, data processing apparatus or system. Thus, it is appreciated that a computer program for configuring a programmable device, apparatus or system to implement the foregoing described methods is envisaged as an aspect of the present disclosure. The computer program may be embodied as source code or undergo compilation for implementation on a processing device, apparatus, or system. Suitably, the computer program is stored on a carrier device in machine or device readable form, for example in solid-state memory, magnetic memory such as disk or tape, optically or magneto-optically readable memory such as compact disk or digital versatile disk, flash memory, etc. The processing device, apparatus or system utilizes the program or a part thereof to configure the processing device, apparatus, or system for operation.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that terms is utilized.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. A cooling system comprising:
   more than one air handling unit (AHU) that each provide cooling air to at least one information technology (IT) module within a large-scale information handling system (LIHS), each AHU comprising:
      one or more actuators that directs the intake of cooling air in a selected mode of operation from among: (i) an outside air mode; and (ii) a mechanically cooled air mode; and
      an AHU controller in communication with the one or more actuators to control the one or more actuators to direct the intake of cooling air in the selected mode of operation, wherein the AHU controller is configured to:
         detect a failure of a component of a mechanical cooling subsystem of a selected AHU; and
         in response to detecting the failure of the component of the mechanical cooling subsystem: configure the selected AHU for the outside air mode; and provide an indication of the selection of the outside air mode based on the detected failure to the AHU supervisory controller; and
   an AHU supervisory controller in communication with each respective AHU controller of the more than one AHU and which executes a cooling mode utility that enables the cooling system to:
      determine whether a trigger condition exists that indicates a risk of vapor condensation in IT modules of the LIHS; and
      in response to determining that the trigger condition exists, trigger each AHU controller to all operate the more than one AHU in a mode of operation selected to avoid condensation.

2. The cooling system of claim 1, further comprising:
   an internal air temperature transducer positioned to detect the air temperature of the cooling air within the LIHS;
   an internal dew point transducer positioned to detect a value related to an internal dew point of the cooling air within the LIHS;
   an outside air temperature transducer positioned to detect an outside air temperature of an outside air source; and
   an outside dew point transducer positioned to detect a value related to a dew point of the outside air source, wherein each AHU controller of a respective AHU is in communication with the internal and outside air temperature and dew point transducers to:
      based on the internal and outside air temperatures and dew points, independently determine the mode of operation that avoids condensation;
      based on the internal and outside air temperatures and dew points, independently determine the mode of operation that avoids vapor condensation;
      configure the respective AHU in the independently determined mode of operation in response to not determining that the AHU supervisory controller is not overriding the independently determined mode of operation; and
      configure the respective AHU in the specified mode of operation by the AHU supervisory controller in response to determining that the AHU supervisory controller is overriding the independently determined mode of operation.

3. The cooling system of claim 1, wherein:
   the AHU supervisory controller determines that the at least one AHU controller is operating in the outside air mode by the AHU supervisory controller based on receiving the indication of the detected failure.

4. The cooling system of claim 1, further comprising:
   an internal air temperature transducer positioned to detect the air temperature of the cooling air within the AHU;
   an internal dew point transducer positioned to detect a value related to an internal dew point of the cooling air within the AHU, the dew point transducer in communication with the AHU controller;
   an outside air temperature transducer positioned to detect an outside air temperature of an outside air source;
   an outside dew point transducer positioned to detect a value related to a dew point of the outside air source, wherein the AHU supervisory controller:
      based on the internal and outside air temperatures and dew points, determines and triggers the mode of operation of all of the one or more AHU that avoids condensation comprising mechanical cooling air mode;
      determines whether at least one AHU is operating in the outside air mode; and
      in response to determining that at least one AHU is operating in the outside air mode, triggers all AHU controllers to operate in the outside air mode to avoid vapor condensation in the cooling air delivered to the at least one IT module.

5. The cooling system of claim 1, wherein:
   the outside air mode comprises: (i) an open mode using solely outside air for cooling; and (ii) mixed mode that includes outside air and recirculated air for cooling; and
   the mechanically cooled air mode comprises: (iii) a closed mode that mechanically cools recirculated air for cooling; and (iv) a multi-mode that mechanically cools a combination of outside and recirculated air.

6. The cooling system of claim 1, wherein:
   the one or more IT modules are arranged with internally housed rack-based information handling systems (IHSs) in a linear array between a cold aisle and a hot aisle; and
   an outlet of each of the more than one AHU are arranged in parallel alignment orthogonal to the cold aisle of the one or more IT modules to direct cooling air perpendicularly to the rack-based IHSs and in alignment with exhaust air movement of the one or more IT modules.

7. A large-scale information handling system (LIHS) comprising:
   at least one information technology (IT) module; and
   a cooling system comprising:
      more than one air handling unit (AHU) that each provide cooling air to at the least one IT module, each AHU comprising:
         one or more actuators that directs the intake of cooling air in a selected mode of operation from among: (i) an outside air mode; and (ii) a mechanically cooled air mode; and an AHU controller in communication with the one or more actuators to control the one or more actuators to direct the intake of cooling air in the selected mode of operation, the AHU controller configured to:
  detect a failure of a component of a mechanical cooling subsystem of a selected AHU; and
  in response to detecting the failure of the component of the mechanical cooling subsystem: configure the selected AHU for the outside air mode; and provide an indication of the selection of the outside air mode based on the detected failure to the AHU supervisory controller; and
an AHU supervisory controller in communication with each respective AHU controller of the more than one AHU and that executes a cooling mode utility that enables the cooling system to:
  determine whether a trigger condition exists that indicates a risk of vapor condensation in IT modules; and
  in response to determining that the trigger condition exists, trigger each AHU controller to all operate the more than one AHUs in a mode of operation selected to avoid condensation.

8. The LIHS of claim 7, wherein the cooling system further comprises:
an internal air temperature transducer positioned to detect the air temperature of the cooling air within the LIHS;
an internal dew point transducer positioned to detect a value related to an internal dew point of the cooling air within the LIHS;
an outside air temperature transducer positioned to detect an outside air temperature of an outside air source; and
an outside dew point transducer positioned to detect a value related to a dew point of the outside air source, wherein each AHU controller of a respective AHU is in communication with the internal and outside air temperature and dew point transducers to:
  based on the internal and outside air temperatures and dew points, independently determine the mode of operation that avoids condensation;
  based on the internal and outside air temperatures and dew points, independently determine the mode of operation that avoids vapor condensation;
  configure the respective AHU in the independently determined mode of operation in response to not determining that the AHU supervisory controller is not overriding the independently determined mode of operation; and
  configure the respective AHU in the specified mode of operation by the AHU supervisory controller in response to determining that the AHU supervisory controller is overriding the independently determined mode of operation.

9. The LIHS of claim 7, wherein:
the AHU supervisory controller determines that the at least one AHU controller is operating in the outside air mode by the AHU supervisory controller based on receiving the indication of the detected failure.

10. The LIHS of claim 7, wherein the cooling system further comprises:
an internal air temperature transducer positioned to detect the air temperature of the cooling air within the AHU;
an internal dew point transducer positioned to detect a value related to an internal dew point of the cooling air within the AHU, the dew point transducer in communication with the AHU controller;
an outside air temperature transducer positioned to detect an outside air temperature of an outside air source;
an outside dew point transducer positioned to detect a value related to a dew point of the outside air source, wherein the AHU supervisory controller:
  based on the internal and outside air temperatures and dew points, determines and triggers the mode of operation of all of the one or more AHU that avoids condensation comprising mechanical cooling air mode;
  determines whether at least one AHU is operating in the outside air mode; and
  in response to determining that at least one AHU is operating in the outside air mode, triggers all AHU controllers to operate in the outside air mode to avoid vapor condensation in the cooling air delivered to the at least one IT module.

11. The LIHS of claim 7, wherein:
the outside air mode comprises: (i) an open mode using solely outside air for cooling; and (ii) mixed mode that includes outside air and recirculated air for cooling; and
the mechanically cooled air mode comprises: (iii) a closed mode that mechanically cools recirculated air for cooling; and (iv) a multi-mode that mechanically cools a combination of outside and recirculated air.

12. The LIHS of claim 7, wherein:
the one or more IT modules are arranged with internally housed rack-based information handling systems (IHSs) in a linear array between a cold aisle and a hot aisle; and
an outlet of each of the more than one AHU are arranged in parallel alignment orthogonal to the cold aisle of the one or more IT modules to direct cooling air perpendicularly to the rack-based IHSs and in alignment with exhaust air movement of the one or more IT modules.

13. A method comprising:
determining, by an air handling unit (AHU) supervisory controller, whether a trigger condition exists that indicates a risk of vapor condensation in at least one information technology (IT) module within a large-scale information handling system (LIHS) that is cooled by more than one air handling unit (AHU) that direct the intake of cooling air in a selected mode of operation from among: (i) an outside air mode; and (ii) a mechanically cooled air mode, wherein the AHU supervisory controller determines that the trigger condition exists based on the internal temperature and dew point of air within and outside of the LIHS; and
in response to determining that the trigger condition exists, triggering all AHUs to operate in a mode of operation selected to avoid condensation, wherein:
  the determining comprises determining whether a failure of one or more AHU controllers that are independently determining a mode of operation for a respective AHU has occurred; and
  the triggering comprises triggering all AHUs to operate in an open mode of operation that is selected to avoid condensation, in response to determining that a failure of the one or more AHU controllers that are independently determining the mode of operation has occurred.

14. The method of claim 13, further comprising:
detecting air temperature and dew point of the cooling air within and outside of the LIHS;
based on the internal and outside air temperatures and dew points, independently determining, by a respective AHU controller, the mode of operation of a respective AHU that avoids vapor condensation;

configuring the respective AHU in the independently determined mode of operation in response to determining that the AHU supervisory controller is not overriding the independently determined mode of operation; and configuring the respective AHU in the specified mode of operation by the AHU supervisory controller in response to determining that the AHU supervisory controller is overriding the independently determined mode of operation.

15. The method of claim 13, further comprising:

detecting a failure of a component of a mechanical cooling subsystem of a selected AHU; and in response to detecting the failure of the component of the mechanical cooling subsystem:

configuring the selected AHU for the outside air mode; and providing an indication of the selection of the outside air mode based on the detected failure to the AHU supervisory controller; and determining, by the AHU supervisory controller, that the at least one AHU controller is operating in the outside air mode by the AHU supervisory controller based on receiving the indication of the detected failure.

16. The method of claim 13, wherein:

the outside air mode comprises: (i) an open mode using solely outside air for cooling; and (ii) mixed mode that includes outside air and recirculated air for cooling; and the mechanically cooled air mode comprises: (iii) a closed mode that mechanically cools recirculated air for cooling; and (iv) a multi-mode that mechanically cools a combination of outside and recirculated air.

17. A method comprising:

determining, by an air handling unit (AHU) supervisory controller, whether a trigger condition exists that indicates a risk of vapor condensation in at least one information technology (IT) module within a large-scale information handling system (LIHS) that is cooled by more than one air handling unit (AHU) that direct the intake of cooling air in a selected mode of operation from among: (i) an outside air mode; and (ii) a mechanically cooled air mode, wherein the AHU supervisory controller determines that the trigger condition exists based on an internal temperature and dew point of air within and outside of the LIHS; and in response to determining that the trigger condition exists, triggering all AHUs to operate in a mode of operation selected to avoid condensation;

determining whether at least one AHU is operating in the outside air mode; and in response to determining that at least one AHU is operating in the outside air mode, triggering all AHU controllers to operate in the outside air mode to avoid vapor condensation in the cooling air delivered to the at least one IT module.

18. The method of claim 17, further comprising:

detecting air temperature and dew point of the cooling air within and outside of the LIHS; and based on the internal and outside air temperatures and dew points, determining, by the AHU supervisory controller, the selected mode of operation for all of the one or more AHU that avoids the trigger condition comprises mechanical cooling air mode.

* * * * *